United States Patent
Tang et al.

(10) Patent No.: US 6,664,202 B2
(45) Date of Patent: Dec. 16, 2003

(54) MIXED FREQUENCY HIGH TEMPERATURE NITRIDE CVD PROCESS

(75) Inventors: Sum-Yee Tang, San Jose, CA (US); May Yuxiang Wang, Palo Alto, CA (US); Lester A. D'Cruz, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/126,495

(22) Filed: Apr. 18, 2002

(65) Prior Publication Data

US 2003/0199175 A1 Oct. 23, 2003

(51) Int. Cl.[7] .............................................. H01L 21/31
(52) U.S. Cl. ...................................... 438/791; 438/791
(58) Field of Search ................................ 438/769, 735, 438/791, 792, 786, 778, 694, 682, 622, 513; 427/255.394

(56) References Cited

U.S. PATENT DOCUMENTS

| | | | |
|---|---|---|---|
| 5,656,123 A | 8/1997 | Salimian et al. | |
| 6,041,734 A | 3/2000 | Raoux et al. | |
| 6,098,568 A | 8/2000 | Raoux et al. | |
| 6,136,388 A | 10/2000 | Raoux et al. | |
| 6,140,255 A * | 10/2000 | Ngo et al. | ................... 438/791 |
| 6,162,709 A | 12/2000 | Raoux et al. | |
| 6,383,874 B1 * | 5/2002 | Sun et al. | ................... 438/287 |

* cited by examiner

*Primary Examiner*—Kamand Cuneo
*Assistant Examiner*—Monica D. Harrison
(74) *Attorney, Agent, or Firm*—Townsend and Townsend and Crew

(57) ABSTRACT

A mixed-frequency, high temperature PECVD process is utilized to create a high quality silicon nitride layer having highly conformal properties. Deposition in an ammonia rich ambient at high temperature reduces microloading between dense and isolated features by improving surface mobility of precursors. High quality nitride films formed by the instant process are particularly suited for front-end applications such as the formation of spacer structures and the formation of contact etch stop layers.

16 Claims, 4 Drawing Sheets

MIXED FREQUENCY HIGH TEMPERATURE NITRIDE CVD PROCESS

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film.

An alternative method of depositing layers over a substrate includes plasma enhanced CVD (PECVD) techniques. Plasma enhanced CVD techniques promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. The relatively low temperature of some PECVD processes helps semiconductor manufacturers lower the overall thermal budget in the fabrication of some integrated circuits.

One commonly known PECVD process is referred to as a single frequency process in which a plasma is formed by applying high frequency RF energy (e.g., 13.56 MHz) to one of two electrodes positioned near the reaction zone. Another well known PECVD process is referred to as a mixed frequency processes or a dual frequency process. In a mixed frequency PECVD process, both high and low frequency RF energy (e.g., one 13.56 MHz signal and one signal less than 1 MHz) is applied to one or more electrodes positioned near the reaction zone.

One type of material that semiconductor manufacturers commonly deposit using PECVD techniques is silicon nitride. Silicon nitride films are used for a variety of different purposes in integrated circuits. Two common applications for silicon nitride films in the front end processing of integrated circuits include the formation of spacer structures around transistor gates and the formation of contact etch stop layers, such as the barrier layer between a premetal dielectric layer and the semiconductor substrate.

As semiconductor device geometries have decreased in size over the years, semiconductor manufacturers are faced with new challenges that must be overcome in order to develop robust, high yield manufacturing processes for the manufacture of integrated circuits. Because of these challenges, sometimes substrate processing techniques that were used successfully in certain previous integrated circuit manufacturing processes are not effective in newer fabrication processes. For example, single frequency, high temperature (e.g., temperatures above 500° C.) silicon nitride films have been successfully used for barrier layers to premetal dielectric layers in a number of different integrated circuits. Such layers have been proven to have low hydrogen content, good step coverage and a relatively low thermal budget as compared to conventional low pressure thermal CVD nitride layers. At least one semiconductor manufacturer has found, however, that such layers may have limitations that make them impractical for use with certain integrated circuits that have relatively complex device fabrication requirements.

As an example, reference is made to FIG. 1, which is a simplified cross-sectional view of a partially formed integrated circuit 10. Partially formed integrated circuit 10 includes a substrate 12 having a shallow trench isolation (STI) structure 14 formed therein. A transistor gate 16 is formed over the substrate and a silicon nitride barrier layer 18 is formed over the gate prior to the formation of an overlying premetal dielectric layer 20, such as a phosphosilicate glass (PSG) layer. Also shown in FIG. 1 are contact holes 22 which are etched through PSG layer 20. While not shown in FIG. 1, contact holes 22 will be further etched through silicon nitride barrier layer 18 at a later substrate processing step.

It has been reported that seams 24, 26 and 28 may form in silicon nitride layer 18 in areas 30, 32 and 34, respectively, where layer 18 is deposited over relatively sharp corners. In some situations such seams may lead to leakage and device failure. In other situations even though the seams may not lead to device failure, the existence of the seams may make a semiconductor manufacturer wary of the integrity of the silicon nitride layer.

Accordingly, new and improved processes for forming uniform, high quality layers of silicon nitride material that can be used for the fabrication of semiconductor devices are continuously being sought.

SUMMARY OF THE INVENTION

Embodiments of the present invention provide a technique for forming PECVD silicon nitride films. In some embodiments, a mixed-frequency, high temperature PECVD process is utilized to create a high quality silicon nitride layer having highly conformal properties. The highly conformal nature of the film allows it to be deposited over sharp corners that may exist in some integrated circuits without forming an undesirable seam in situations where PECVD silicon nitride layers previously known to the inventors are susceptible to causing device failure. In one embodiment the silicon nitride layer is deposited in an ammonia rich ambient where the ratio of ammonia to silane in the process gas is at least 10:1. Embodiments of the invention are particularly well suited for front-end applications, such as the formation of spacer structures and the formation of contact etch stop layers, but may be used in other applications also as appropriate. Additionally, embodiments of the invention may be used in the fabrication of integrated circuits having minimum feature sizes less than or equal to 0.13 microns.

According to one embodiment of the invention, a method of forming a silicon nitride layer over a substrate disposed in a substrate processing chamber is disclosed. The method flows a process gas comprising silane and ammonia into the processing chamber, wherein a flow ratio of said ammonia to said silane in said process gas is at least 10:1. A plasma is formed from the processing gas by applying high and low frequency RF power to one or more electrodes in the chamber to deposit the silicon nitride layer.

In one embodiment the process gas used to deposit the silicon nitride layer further includes molecular nitrogen. In other embodiments, during deposition of the silicon nitride layer, the substrate is maintained at a temperature between about 500–580° C. and/or the pressure within the chamber is maintained at between about 1.0–4.0 Torr. In some embodiments the silicon nitride film is deposited over a transistor gate as a barrier layer prior to the formation of a premetal dielectric layer. And in still another embodiment, the silicon nitride film exhibits a conformity of at least 90%.

These and other embodiments of the present invention, as well as its features and some potential advantages are described in more detail in conjunction with the text below and attached figures.

DESCRIPTION OF THE SPECIFIC EMBODIMENTS

Figure 1:
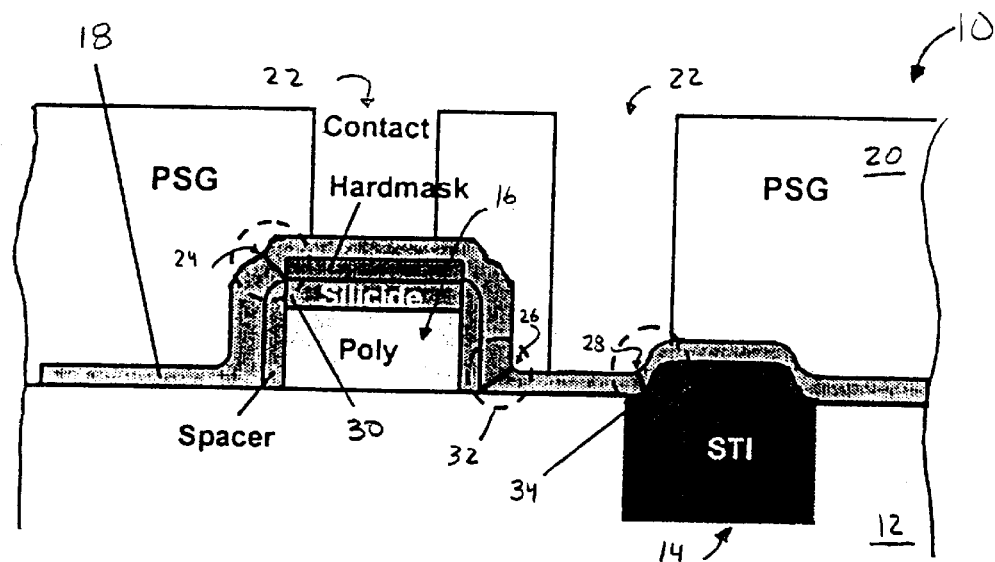
FIG. 1 is a simplified cross-sectional view of a partially formed integrated circuit that includes a silicon nitride barrier layer formed according to a previously known process.

Embodiments of the invention provide a highly conformal, yet relatively dense silicon nitride film that can be successfully integrated into a variety of semiconductor fabrication processes in situations where previously known PECVD silicon nitride films are likely to form an undesirable seam as described above with respect to FIG. 1. Embodiments of the invention deposit a highly conformal silicon nitride film by employing mixed frequency RF power to form a plasma from an ammonia-rich silicon nitride process gas.

Figure 2:
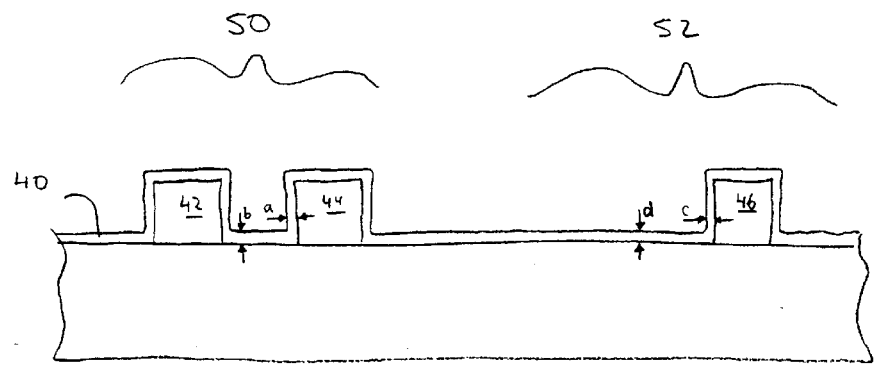
FIG. 2 is a simplified cross-sectional view of a partially formed integrated circuit that illustrates the definition of step coverage as used herein.

The "conformity" of a silicon nitride layer or other type of material can be measured by determining the step coverage of the layer when deposited over various features. As used herein, step coverage is defined with respect to the illustration in FIG. 2, which is a simplified cross-sectional view of a partially formed integrated circuit. In FIG. 2, which is not drawn to scale, a silicon nitride film 40 is shown deposited over adjacent polysilicon gates 42 and 44 that represent a relatively dense portion 50 of an integrated circuit. A relatively isolated portion 52 of the circuit is also shown in FIG. 2 where a polysilicon gate 46 is separated from gate 44 by a distance that is an order of magnitude more than the spacing between gates 42 and 44 in the dense portion 50. The step coverage in the high density area can be determined by dividing the thickness a of layer 40 on the sidewall of a gate in the dense area by the thickness b of layer 40 at the bottom of the trench formed between gates 42 and 44. Conversely the step coverage in the low density area can be determined by dividing the thickness c of layer 40 on the sidewall of gate 46 in the low density area by the thickness d of layer 40 on the flat, bottom surface of the low density area.

Another definition, "microloading," that is referred to herein can also be described with respect to FIG. 2. Microloading is defined as the difference in sidewall thickness and step coverage between features in dense portion 50 of an integrated circuit and those in the isolated portion 52. Microloading is important as it affects etch uniformity during spacer formation and contact etch steps. Embodiments of the invention are able to deposit a PECVD silicon nitride layer that has a step coverage of greater than 90% in the dense portions of an integrated circuit and exhibits microloading of less than 10%. As used herein, the "dense" or "high density" portion of an integrated circuit is the portion of the IC that includes a variety of features that are spaced apart a distance equal to or close to the minimum feature size of the semiconductor fabrication process used to form the integrated circuit. In contrast, the "isolated" or "low density" portion of the integrated circuit includes features that are spaced apart a distance that is an order of magnitude or greater than the spacing of features in the dense portion.

Figure 3:
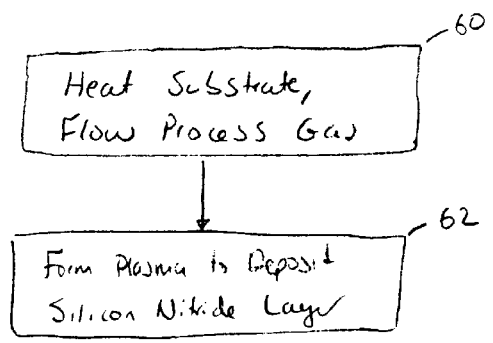
FIG. 3 is a flow chart depicting the steps according to one embodiment of the method of the present invention.

FIG. 3 is a flowchart illustrating the basic steps according to one embodiment of the invention. As shown in FIG. 3, the invention includes heating the substrate to a desired deposition temperature and stabilizing a flow of the process gas prior to deposition (step 60). In one embodiment process gas comprises ammonia ($NH_3$), silane ($SiH_4$) and molecular nitrogen ($N_2$) where the ratio of $NH_3$ to $SiH_4$ in the process gas is greater than 10:1. Next, a plasma is formed from the process gas using mixed frequency RF power to deposit the silicon nitride film (step 62).

The inventors have found that the combination of (i) using mixed frequency RF power rather than single frequency RF power and (ii) using a high $NH_3$ to $SiH_4$ ratio during deposition of the silicon nitride layer may result in the formation of a silicon nitride film that does not suffer from the formation of undesirable seams in sharp corners in applications where other PECVD silicon nitride films do form seams as described above with respect to FIG. 1. Experiments performed by the inventors indicated that the ratio of $NH_3$ to $SiH_4$ in a single frequency RF silicon nitride PECVD deposition process has little effect on the step coverage of the film. The $NH_3$ to $SiH_4$ ratio has a definite effect on the step coverage of a silicon nitride film deposited using a mixed frequency RF process however. Embodiments of the invention may apply the low frequency RF energy to either the upper or lower electrode (e.g., either the gas distribution manifold or the substrate pedestal).

Step coverage (conformity) of the nitride layer is a function of sticking coefficient which translates to the surface mobility of precursors. While not being limited to any particular theory, the inventors believe that the application of low frequency RF power (power less than 1 MHz) to the plasma formation process, enhances chemical reactions in areas such as the sharp corners 30, 32 and 34 shown in FIG. 1. Generally, electrons oscillate with the high frequency RF electric field. Application of the low frequency RF power, however, allows heavier ions that are relatively immobile to oscillate also so that such molecules are more likely to reach and participate in film forming reactions in the sharp corners. It is also believed that the high $NH_3$ flow rate helps increase the sticking coefficient of $Si(NH_2)_x$ reactive species, thus enhancing nucleation in the corner areas to increase the conformity.

Figure 4:
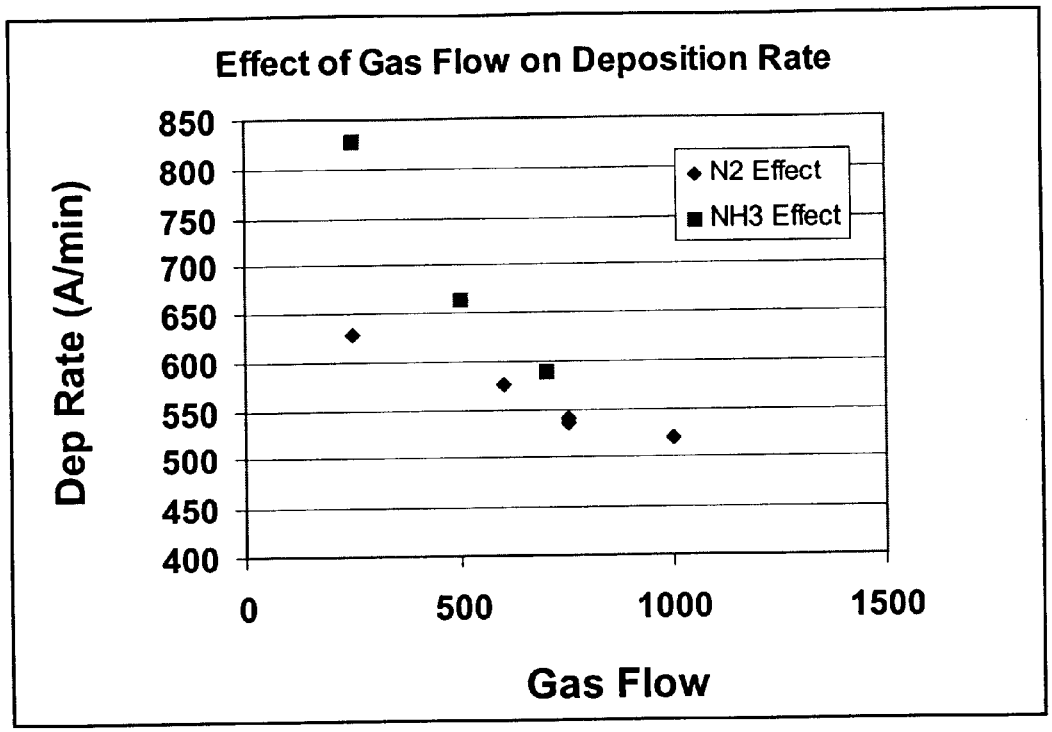
FIG. 4 is a graph showing the effect of $NH_3$ flow and $N_2$ flow on deposition rate during deposition of a silicon nitride layer.

The high $NH_3$ flow rate also slows deposition of the silicon nitride layer, which is desirable in some applications. FIG. 4 is a graph that shows the effect of $NH_3$ flow rate on silicon nitride film deposition rate. As shown in FIG. 4, varying the flow of $NH_3$ from 250 sccm to approximately 750 sccm decreases the deposition rate of the silicon nitride layer from about 840 Å/min to below 600 Å/min. As also shown in FIG. 4, however, varying the $N_2$ flow rate does not have nearly as a significant effect on film deposition rate. Some embodiments of the invention include $N_2$ in the process gas, however, as a dilution gas to improve gas mixing and uniformity control. It is possible to use other dilution gases in other embodiments.

Embodiments of the invention also control the amount of RF energy applied to the electrodes to prevent the formation of arcing. In some embodiments the amount of low frequency RF energy is less than 1.0 W/in$^2$ (50 Watts for an 8" substrate). In other embodiments between 20–30 Watts of low frequency RF energy is applied (between 0.40–0.60 W/in$^2$). Also, some embodiments control the total amount of RF energy so that the total energy level (low frequency and high frequency power) is less than 2.5 W/in$^2$ (125 Watts) while others control the total RF energy level to less than 2.0 W/in$^2$ (100 Watts). Generally the amount of high frequency RF energy applied is greater than the amount of low frequency applied, and in some embodiments between 1.0–2.0 W/in$^2$ of high frequency energy is used to form the plasma (50–100 Watts).

Still additional embodiments of the invention heat the substrate to a temperature between 500–580° C. during deposition of the silicon nitride film. Such a relatively high deposition temperature helps improve film conformity and also reduces the amount of hydrogen incorporated into the deposited film. The use of a deposition temperature above 500° C. helps maintain the hydrogen content of the silicon nitride films deposited according to embodiments of the invention within a range of 13–16 atomic percent even when the high ammonia flow rates are employed. The substrate may be heated, for example, with a resistively heated pedestal as described below. Additionally, some embodiments of the invention use a low chamber pressure to further increase ion bombardment on the substrate thereby increasing film density. In some embodiments of the invention the silicon nitride film has a density of between 2.6 and 2.9 g/cm$^3$ inclusive on both sidewall and flat surfaces. Ion bombardment also helps to promote surface mobility of reactants by desorption. Higher surface mobility, in turn, results in more uniform deposition. In some embodiments, deposition pressure is less than 5.0 Torr while in others it is between 1.0–3.0 Torr.

Exemplary PECVD System

Figure 5:
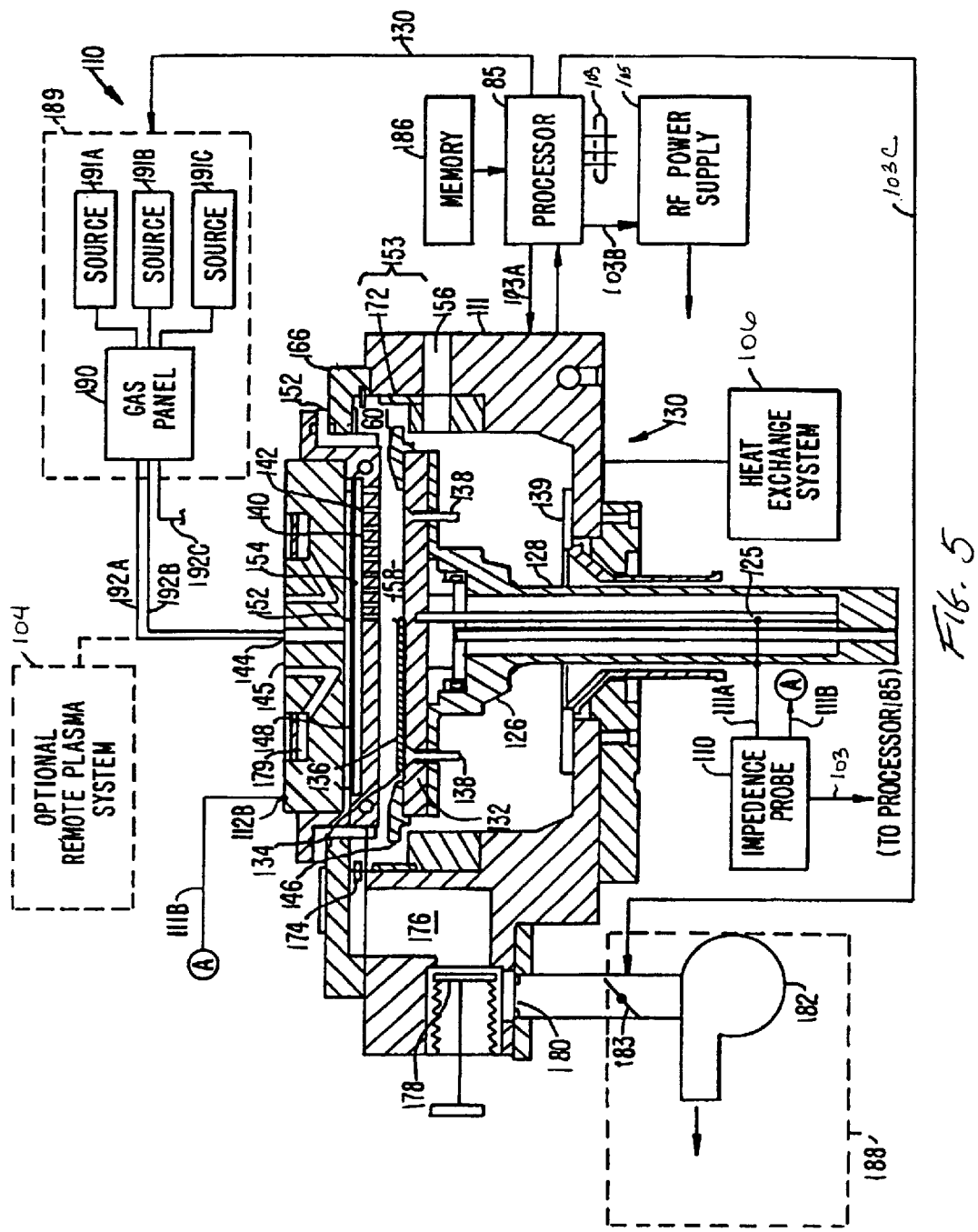
FIG. 5 is a simplified diagram of an exemplary PECVD system that can be used to deposit silicon nitride films according to various embodiments of the present invention.

The method of the present invention can be practiced in any appropriate capacitively-coupled, plasma enhanced CVD deposition chamber. One example of such a chamber 100 is shown in FIG. 5. CVD system 100 shown in FIG. 5 includes a reactor chamber 130, a vacuum system 188, a gas delivery system 189, an RF power supply 105, a heat exchange system 106, a ceramic pedestal 132 and a processor 185 among other major components. Gas delivery system 189 delivers gases to chamber 130 via gas lines 192A–C. Gas delivery system 189 includes gas supply panel 190 and various gas sources 191A–C (additional sources may be added if desired) containing gases (such as SiH$_4$, NH$_3$ and N$_2$). Generally, the supply line for each of the process gases includes a shut-off valve (not shown) that can be used to automatically or manually shut off the flow of process gas, as well as a mass flow controller (also not shown) that measures the flow of gas or liquid through each of the supply lines.

Gas supply panel 190 has a mixing system that receives the deposition gases from the sources 191A–C and mixes the gases prior to sending them to a central gas inlet 144 in a gas feed cover plate 145 via supply lines 192A–C (other lines may be present, but are not shown). In this exemplary chamber, the mixing system, the input manifold to the mixing system, and the output manifold from the mixing system to the central inlet 144 are made of nickel or of a material such as alumina plated with nickel.

The process gas is injected into reactor 130 through central gas inlet 144 in gas-feed cover plate 145 to a first disk-shaped space 148 and from thence through passageways (not shown) in a baffle plate (or gas blocker plate) 152 to a second disk-shaped space 154 to showerhead 140. Showerhead 140 includes a large number of holes or passageways 142 for jetting the process gas into reaction zone 158.

Figure 6A:
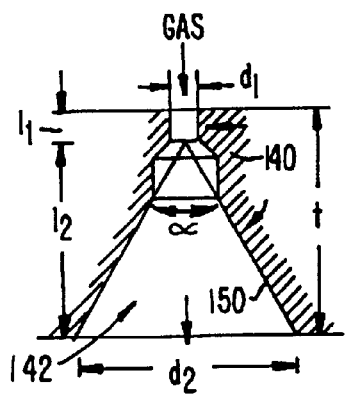
FIGS. 6A and 6B are cross-sectional views of examples of conical holes that may be included within the gas distribution manifold shown in FIG. 5.

Preferably, each of the holes 142 is a "conical hole" as described in detail in U.S. Pat. No. 4,854,263, which is incorporated by reference herein. FIG. 6A is a schematic view of one example of a conical hole that represents one of the many holes in showerhead 140. Each conical hole has a conical section 150 that faces the substrate during processing. The holes are sized to promote laminar flow through showerhead 140. The presence of conical section 150 within the gas distribution hole improves the dissociation of reaction gases thereby increasing the plasma density and the ionization efficiency. The improved dissociation is particularly beneficial when gases that are difficult to break apart such as N$_2$ are used for deposition.

Figure 6B:
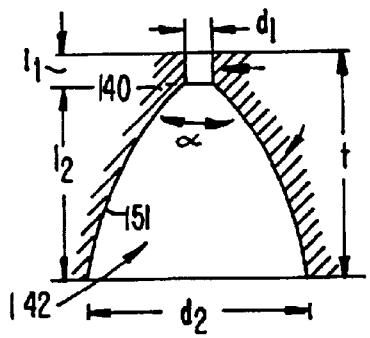

As used herein, the term "conical hole" refers to any hole designed to increase dissociation and reactivity of gases introduced into reaction zone 158 through the hole where the diameter of the gas outlet is larger than the diameter of the gas inlet. Thus, vertical cross-sectional shapes other than cones are included within the meaning of "conical hole" as used herein. Another example of a conical hole is shown in FIG. 6B. The hole shown in FIG. 6B has a concave cross-section 151. Still other holes having other vertical cross-sections including convex, parabolic, hyperbolic, bowl-shaped and semi-ellipsoidal among others can also be used.

Referring back to FIG. 5, the process gas jets from holes 142 in showerhead 140 into reaction zone 158 between the showerhead and the pedestal so as to react at the surface of wafer 136. The process gas byproducts then flow radially outward across the edge of wafer 136 and a flow restrictor ring 146, which is disposed on the upper periphery of pedestal 132 when pedestal 132 is in the processing position. From thence, the process gas flows through a choke aperture formed between the bottom of annular isolator 164 and the top of chamber wall liner assembly 153 into pumping channel 160.

A vacuum system 188 is used to maintain a specified pressure in the chamber and remove gaseous byproducts and spent gases from the chamber. Vacuum system 188 includes a vacuum pump 182 and a throttle valve 183. Upon entering pumping channel 160, the exhaust gas is routed around the perimeter of the process chamber, to be evacuated by a vacuum pump 182. Pumping channel 160 is connected through exhaust aperture 174 to pumping plenum 176. Exhaust aperture 174 restricts the flow between the pumping channel and the pumping plenum. Valve 178 gates the exhaust through exhaust vent 180 to vacuum pump 182. Throttle valve 183 is controlled by processor 185 according to a pressure control program stored in memory 186 which compares a measured signal from a pressure sensor (not shown), such as a manometer, against a desired value that is stored in memory or generated according to the control program. Pumping channel 160 and its components are designed to minimize the effects of unwanted film deposition by directing the process gas and byproducts into the exhaust system.

A resistively-heated, ceramic pedestal 132 supports wafer 136 in a wafer pocket 134. Pedestal 132 may be used to heat the substrate during PECVD deposition processes to temperatures above 500° C. Pedestal 132 may be moved vertically between a processing position (for example, as shown in FIG. 5) and a lower loading position using a self-adjusting lift mechanism. With pedestal 132 in the lower loading position (slightly lower than at slit valve 156), a robot blade (not shown) in cooperation with the lift pins and the lifting ring transfers wafer 36 in and out of chamber 130 through slit valve 156, which can be vacuum-sealed to prevent the flow of gas into or out of the chamber through slit valve 156. Lift pins 138 raise an inserted wafer (not shown) off the robot blade, and then the pedestal rises to raise the wafer off the lift pins onto the wafer pocket on the upper surface of the pedestal. A suitable robotic transfer assembly is described in commonly assigned U.S. Pat. No. 4,951,601, issued to Maydan et al. Through the use of the self-aligning lift mechanism, pedestal 132 then further raises wafer 136 into the processing position, which is in close proximity to gas distribution manifold 140.

Figure 7:
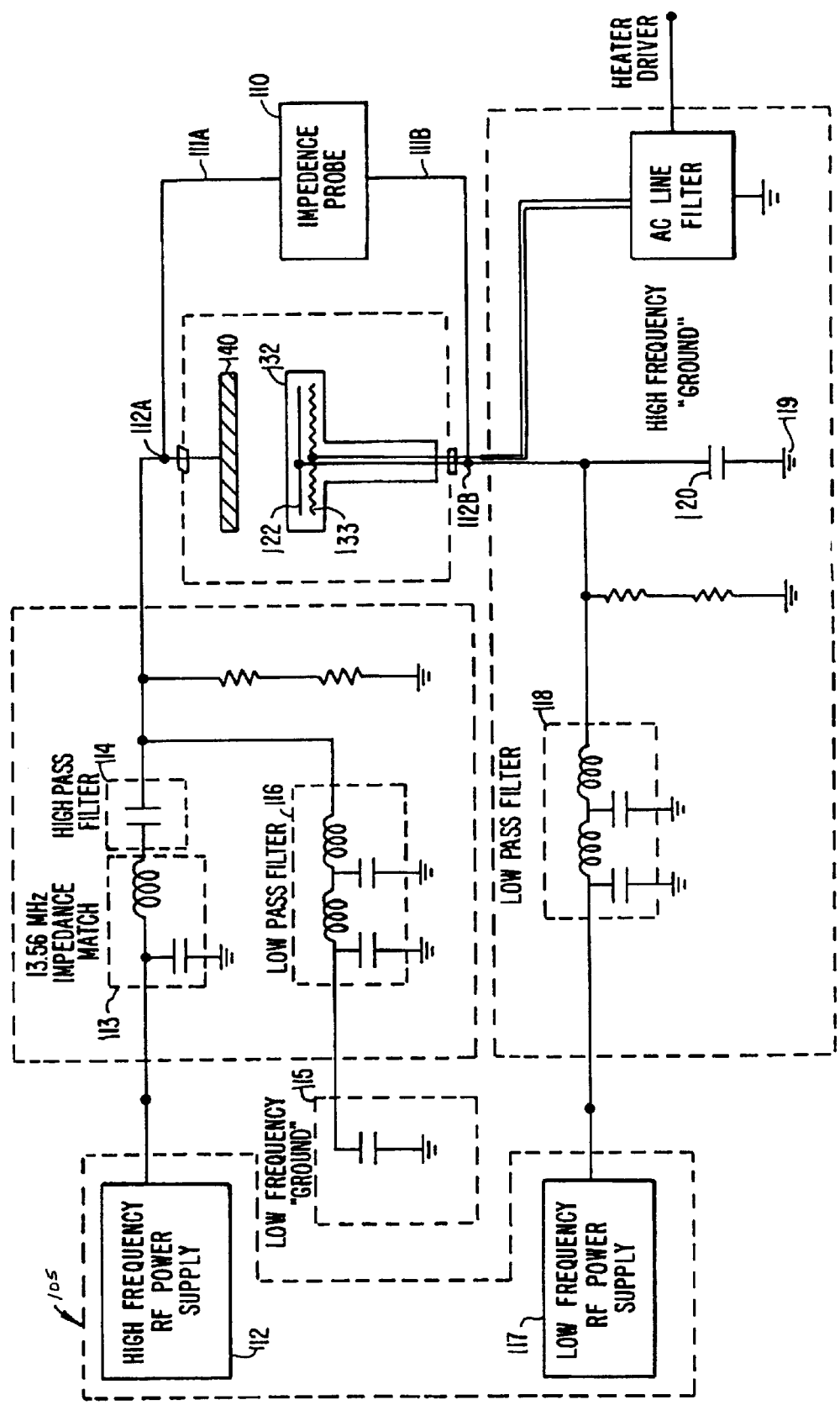
FIG. 7 is a simplified block diagram showing an RF filter and matching network that may be employed to decouple the low and high frequency RF waveforms in the PECVD system shown in FIG. 5.

An RF power supply 105 provides both high and low radio frequency (RF) power to the chamber for plasma-enhanced processes. FIG. 7 is a schematic circuit diagram showing an external RF circuit that includes a high frequency RF source 112 and a low frequency RF source 117. The circuit inputs high frequency RF power to gas distribution manifold 140 of chamber 130 shown in FIG. 5 and inputs low frequency RF power to RF electrode 122 embedded in substrate holder 132.

The high and low frequency RF waveforms are decoupled by a network of high pass and low pass filters. The low frequency amplitude is maximized at the plasma sheath located at the surface of the substrate support and is minimized at the gas distribution system. The high frequency amplitude is maximized at the plasma sheath adjacent the gas distribution system and the high frequency voltage is minimized at the surface of the substrate support. The gas distribution system is a "pseudo-ground" for the low frequency RF power and the voltage is minimized to prevent arcing. Decoupling of the low and high frequency RF power results in a decrease of the self DC bias as low frequency power increases. Thus, ion energy is directly controlled by the low frequency RF signal voltage amplitude through the bottom plasma sheath.

Interference between the high and low frequency RF power is minimized across the top and bottom plasma sheaths by an external RF match unit that which matches the impedance at high frequency RF and the impedance of the decoupled low frequency. Otherwise, the interferences would produce high voltages at the electrodes and result in arcing at the gas distribution system damaging the showerhead. The use of a low frequency bottom plasma sheath and a predominantly high frequency top plasma sheath induces a harmonic oscillation frequency that may be increased or decreased by the external RF circuit as desired.

As shown in FIG. 7, high frequency RF source 112 is connected to a high frequency impedance match unit 113 and a high pass filter 114 that shields high frequency RF source 112 from low frequency RF power. High frequency RF source 112 is also shielded from a low frequency ground 115 by a low pass filter 116. Low frequency RF source 117 is connected to a low pass filter 118 that shields the low frequency RF source from high frequency RF power. The low frequency input is also shielded from a high frequency ground 119 that includes a high pass filter 120.

RF power delivery provided by the configuration shown in FIG. 7 is designed to maximize the 13.56 MHz voltage amplitude for efficient electron impact dissociation and minimize the low frequency oscillation at the showerhead electrode. Indeed, as described in more detail below, the present inventors discovered that phase and potential interferences between the low and high frequencies should be minimized at the conical holes in showerhead 140 to prevent plasma instabilities and microarcing. The RF network is also designed to maximize the low frequency potential at the lower electrode which represents a "pseudo-ground" for the 13.56 MHz signal. This limits the 13.56 MHz oscillation at the lower electrode and prevents formation of a self DC bias (<20 V), so that the ion energy can be directly controlled by the LF voltage amplitude. As a result, there can be a reduction of charging effects at the wafer surface and a reduction of plasma induced damages.

Referring back to FIG. 5, a liquid heat exchange system 106 employs a liquid heat exchange medium, such as water or a water-glycol mixture, to remove heat from the reactor chamber and maintain certain portions of the chamber at a suitable temperature for stable process temperatures. Liquid heat exchange system 106 delivers liquid to various components of chamber 130 to maintain these components at a suitable temperature during the high temperature processing. This system 106 acts to decrease the temperature of some of these chamber components in order to minimize undesired deposition onto these components due to the high temperature processes. Heat exchange passages 179 within gas feed cover plate 145 allow the heat exchange liquid to circulate through gas feed cover plate 145, thus maintaining the temperature of gas feed cover plate 145 and adjacent components. Liquid heat exchange system 106 includes connections (not shown) that supply the liquid (such as water) through a heat exchange liquid manifold (not shown) for delivering the liquid to the gas distribution system including showerhead 140 (discussed below). A water flow detector detects the water flow from a heat exchanger (not shown) to enclosure assembly.

Motors and optical sensors (not shown) are used to move and determine the position of movable mechanical assemblies such as throttle valve 183 and pedestal 132. Bellows (not shown) attached to the bottom of pedestal 132 and chamber body 111 form a movable gas-tight seal around the pedestal. The pedestal lift system, motors, gate valve, plasma system, including an optional remote plasma system 104 (which may be used to provide chamber clean capability using a remote plasma formed using, for example, a microwave source), and other system components are controlled by processor 185 over control lines 103 and 103A–D, of which only some are shown, as described in more detail below.

Invention Examples

In order to prove the effectiveness of the present invention, the inventors performed a number of tests and experiments using a resistively heated DxZ chamber manufactured by Applied Materials. The DxZ chamber included a gas distribution manifold that had conical holes similar to those shown in FIG. 6A.

A first of these experiments compared the conformity of silicon nitride films deposited according to the techniques of the present invention with silicon nitride films deposited from a single frequency PECVD process. In this first experiment, both silicon nitride films were deposited over a substrate that had a 0.18 micron repeating polysilicon gate structure having an aspect ratio of 1:1. The substrate had both dense and isolated areas so that step coverage could be measured separately in each area and microloading calculated.

Table 1 below sets forth the parameters of the silicon nitride film deposited according to the techniques of the present invention as well as the parameters used for the single frequency silicon nitride deposition process In both processes shown in Table 1, low frequency power was applied to the gas distribution manifold rather than the pedestal.

TABLE 1

Silicon Nitride Deposition Processes Used in the First Experiment

| Parameter | Invention Example | SF Nitride Process |
|---|---|---|
| Gas Flows | $SiH_4$ 50 sccm<br>$NH_3$ 700 sccm<br>$N_2$ 500 sccm | $SiH_4$ 50 sccm<br>$NH_3$ 30 sccm<br>$N_2$ 4500 sccm |
| $NH_3$:$SiH_4$ ratio | 14:1 | 0.6:1 |
| Spacing | 550 mils | 490 mils |
| High Frequency Power (13.56 MHz) | 50 W (1.0 W/in$^2$) | 415 W |
| Low Frequency Power (350 KHz) | 26 W (0.5 W/in$^2$) | — |
| Pressure | 2.5 Torr | 6 Torr |
| Temperature | 550° C. | 550° C. |

The silicon nitride film deposited according the techniques of the present invention shown in Table 1 exhibited a step coverage of 98% in the dense area and a step coverage of 93% in the isolated area. In contrast, the previously known single frequency process shown in Table 1 exhibited a step coverage of about only 50% in both the dense and isolated areas. Also, microloading of less than 5% was seen in the silicon nitride film deposited according to the techniques of the present invention while microloading of about 30% was seen in the single frequency RF silicon nitride film. Step coverage and microloading were both calculated using the definitions set forth above with respect to FIG. 2 from measurements taken on appropriate SEM photographs. Furthermore, SEM cross sectional photographs of the substrates in the first experiment indicated that undesirable seams were clearly formed in the single frequency process while no seams were present in the nitride film deposited according to the present invention.

In a second set of experiments the effect of substrate temperature on step coverage was determined. In these experiments, single frequency and mixed frequency silicon nitride deposition processes were performed at both 480° C. and 550° C. The mixed frequency silicon nitride deposition processes each employed a high frequency RF power level of 1.0 W/in$^2$ and a low frequency RF power level between 0.4 and 0.6 W/in$^2$. SEM photos taken from these second set of experiments indicated that in each instance the higher deposition temperature resulted in improved conformity than the lower deposition temperature.

In a third experiment, the $NH_3$:$SiH_4$ ratio was varied using a mixed frequency RF process in which the low frequency RF signal was applied to the pedestal (bottom electrode) and silicon nitride films were deposited over a substrate having a repeating 0.18 micron polysilicon gate pattern similar to the pattern in the first experiment. The $NH_3$ flow rate was varied in this experiment from 250 sccm to 750 sccm. Except for the $NH_3$ flow rate, the process parameters in this third experiment were the same as those set forth in column 2 of Table 1 above. SEM photographs from this third experiment indicated that an undesirable seam was formed in the sharp corner areas when the $NH_3$:$SiH_4$ ratio was 5:1 ($NH_3$ flow of 250 sccm). At $NH_3$:$SiH_4$ ratios of 10:1 or higher ($NH_3$ flows of 500 sccm and 750 sccm), however, film deposition was more conformal and the seam disappeared.

The description above is intended to help illustrate the principles of this invention and is not intended to limit the scope of this invention in any way. Also, while the invention has been described with reference to a specific example thereof, it will be apparent to a person of ordinary skill in the art that various changes and modifications can be made to the concepts presented herein without departing from the spirit and scope of the invention. For example, while the invention was described with respect to the formation of a silicon nitride barrier layer it is also applicable to the deposition of silicon nitride films for other applications including sidewall spacers. These equivalents and alternatives are intended to be included within the scope of the present invention.

What is claimed is:

1. A method of forming a silicon nitride layer over a substrate disposed in a substrate processing chamber, said method comprising:
    flowing a process gas comprising silane and ammonia into the processing chamber, wherein a flow ratio of said ammonia to said silane in said process gas is at least 10:1; and
    forming a plasma from the processing gas by applying both high and low frequency RF power to one or more electrodes in the chamber to deposit said silicon nitride layer.

2. The method of claim 1 wherein a total amount of RF power applied to said one or more electrodes during deposition of said silicon nitride layer is 2.5 Watts/in$^2$ or less.

3. The method of claim 2 wherein 1.0 Watts/in$^2$ or less of low frequency RF power is applied to one of said electrodes during deposition of said silicon nitride layer.

4. The method of claim 2 wherein 2.0 Watts/in$^2$ or less of high frequency RF power is applied to one of said electrodes during deposition of said silicon nitride layer.

5. The method of claim 1 wherein said substrate is maintained at a temperature between about 500–580° C. during deposition of said silicon nitride layer.

6. The method of claim 1 wherein pressure within the chamber is maintained at between about 1.0–4.0 Torr during deposition of said silicon nitride layer.

7. The method of claim 1 wherein said process gas further comprises molecular nitrogen.

8. The method of claim 1 wherein said silicon nitride film is deposited over a transistor gate as a barrier layer prior to the formation of a premetal dielectric layer.

9. The method of claim 8 wherein said silicon nitride film exhibits a conformity of at least 90%.

10. The method of claim 9 wherein said silicon nitride layer has a density of between about 2.6 and 2.9 g/cm$^3$.

11. The method of claim 9 wherein said silicon nitride film exhibits less than 10% microloading between dense structures spaced about 0.13 microns or less apart and isolated structures spaced apart by at least an order of magnitude more than said dense structures.

12. A method of forming a silicon nitride layer over a substrate disposed in a substrate processing chamber, said method comprising:

flowing a process gas comprising silane, ammonia and molecular nitrogen into the substrate processing chamber, wherein a flow ratio of said ammonia to said silane in said process gas is at least 10:1;

heating the substrate to a temperature of at least 500° C.; and forming a plasma from the processing gas by applying both high and low frequency RF power to one or more electrodes in the chamber to deposit said silicon nitride layer, wherein (i) a power level at which the low frequency power is applied is less than a power level at which the high frequency power is applied, (ii) the low frequency RF power level is less than or equal to 1.0 Watts/in$^2$ and (iii) the high frequency RF power is less than or equal to 2.0 Watts/in$^2$.

13. The method of claim 12 wherein between 0.4 and 0.6 Watts/in$^2$ of low frequency RF power is applied to one of said electrodes during deposition of said silicon nitride layer.

14. The method of claim 12 wherein between 1.0 and 2.0 Watts/in$^2$ of high frequency RF power is applied to one of said electrodes during deposition of said silicon nitride layer.

15. The method of claim 12 wherein said substrate is maintained at a temperature less between about 500–580° C. during deposition of said silicon nitride layer.

16. The method of claim 15 wherein pressure within the chamber is maintained at between about 1.0–4.0 Torr during deposition of said silicon nitride layer.

* * * * *